(12) United States Patent
Kwak et al.

(10) Patent No.: US 11,800,705 B2
(45) Date of Patent: Oct. 24, 2023

(54) FLASH MEMORY DEVICE USED IN NEUROMORPHIC COMPUTING SYSTEM

(71) Applicant: KOREA INSTITUTE OF SCIENCE AND TECHNOLOGY, Seoul (KR)

(72) Inventors: Joon Young Kwak, Seoul (KR); Eunpyo Park, Seoul (KR); Suyoun Lee, Seoul (KR); Inho Kim, Seoul (KR); Jong-Keuk Park, Seoul (KR); Jaewook Kim, Seoul (KR); Jongkil Park, Seoul (KR); YeonJoo Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 1 day.

(21) Appl. No.: 17/538,747

(22) Filed: Nov. 30, 2021

(65) Prior Publication Data

US 2022/0399353 A1  Dec. 15, 2022

(30) Foreign Application Priority Data

Jun. 7, 2021  (KR) .................. 10-2021-0073555

(51) Int. Cl.
| | | |
|---|---|---|
| *H01L 29/788* | (2006.01) | |
| *H01L 29/43* | (2006.01) | |
| *H01L 29/423* | (2006.01) | |
| *H10B 41/30* | (2023.01) | |
| *H01L 29/66* | (2006.01) | |

(52) U.S. Cl.
CPC ....... *H10B 41/30* (2023.02); *H01L 29/42324* (2013.01); *H01L 29/437* (2013.01); *H01L 29/66825* (2013.01); *H01L 29/788* (2013.01)

(58) Field of Classification Search
None
See application file for complete search history.

(56) References Cited

U.S. PATENT DOCUMENTS

2016/0308006 A1 * 10/2016 Park ..................... H01L 29/24

FOREIGN PATENT DOCUMENTS

| CN | 108831931 A | * 11/2018 | ....... H01L 29/66825 |
|---|---|---|---|
| CN | 111725326 A | * 9/2020 | |
| CN | 110663117 B | * 5/2021 | ............ H01L 21/04 |
| KR | 100803167 B1 | 2/2008 | |
| KR | 1020090052061 A | 5/2009 | |
| KR | 100910524 B1 | 7/2009 | |

(Continued)

OTHER PUBLICATIONS

English translation of CN 111725326A (Year: 2020).*
English translation of CN 108831931A (Year: 2018).*
English translation of CN 110663117B (Year: 2021).*

*Primary Examiner* — Xiaoming Liu
(74) *Attorney, Agent, or Firm* — Rabin & Berdo, P.C.

(57) ABSTRACT

A flash memory device is provided. The flash memory device is disposed on a substrate, a channel layer made of a two-dimensional material, sources and drains disposed at both ends of the channel layer, a tunneling insulating layer having a first dielectric constant and a tunneling insulating layer disposed on the channel layer, a floating gate made of a two-dimensional material, a blocking insulating layer disposed on the floating gate and having a second dielectric constant greater than the first dielectric constant, and an upper gate disposed on the blocking insulating layer.

7 Claims, 19 Drawing Sheets

(56) References Cited

FOREIGN PATENT DOCUMENTS

| | | | |
|---|---|---|---|
| KR | 101075077 | B1 | 10/2011 |
| KR | 101563770 | B1 | 10/2015 |
| KR | 1020160120057 | | 10/2016 |
| KR | 102051209 | B1 | 12/2019 |
| KR | 102062717 | B1 | 1/2020 |
| KR | 102232755 | B1 | 3/2021 |

* cited by examiner

FLASH MEMORY DEVICE USED IN NEUROMORPHIC COMPUTING SYSTEM

CROSS-REFERENCE TO RELATED APPLICATIONS

This US non-provisional patent application claims priority under 35 USC § 119 to Korean Patent Application No. 10-2021-0073555, filed on Jun. 7, 2021, the entirety of which is hereby incorporated by reference.

BACKGROUND

The present invention relates to a flash memory device, and more particularly, to a flash memory device used in a neuromorphic computing system.

Recently, interest in artificial intelligence AI is growing. Processing vast amounts of data for the recognition of language, images and sounds requires fast and accurate calculations. However, in the current von Neumann-based computing architecture, the data bus between the CPU and memory to process information has been the main bottleneck in high-speed and low-power computing for big data.

In this regard, neuromorphic computing, which mimic the human brain, has become one of the most viable technology in future computing systems. Neuromorphic computing systems mainly consist of two different types of devices, neurons and synapses. A synapse plays an important role in transmitting information from a pre-synaptic neuron to a post-synaptic neuron. A synapse contains weight information which is altered when neuronal activity changes the strength of the connections between the neurons. In neuromorphic computing, weights are usually expressed as conductance levels of synaptic devices.

Two-terminal devices, such as memristors (ReRAM, PCRAM, etc.), have been introduced as promising candidates for artificial synapses. A memristor, as the name suggests, acts as a memory resistor. However, in the formation of an array for an artificial neural network using two-terminal memristors, unwanted leakage current through the sneak path becomes one of the major issues standing in the way of system implementation. Many studies have suggested ideas to circumvent this issue, such as using additional selector devices like transistors, diodes, and OTS devices or applying complicated pulse inputs.

Recently, three-terminal-based synaptic devices have become more popular in an effort to solve this issue. A gate of a three-terminal device controls and separates the weight updating and reading paths, effectively preventing the sneak path problem. Also, the absence of an additional selector device, which is required for a two-terminal-based synaptic array, helps reduce the total chip area.

Given the aforementioned advantages, flash memory devices have become promising candidates as synaptic devices of neuromorphic computer systems. Several flash-type synaptic devices, including silicon, CNT (carbon nanotube), and TMDC (transition metal dichalcogenide)-based flash devices, can improve the characteristics of existing synaptic devices.

SUMMARY

Example embodiments of inventive concepts provide a flash memory device comprising a substrate; a channel layer disposed on the substrate and made of a two-dimensional material; a source and a drain disposed at both ends of the channel layer; a tunneling insulating layer disposed on the channel layer and having a first dielectric constant; a floating gate disposed on the tunneling insulating layer and made of a two-dimensional material; a blocking insulating layer disposed on the floating gate and having a second dielectric constant greater than the first dielectric constant; and an top gate disposed on the blocking insulating layer.

In example embodiments, the channel layer may include one of $MoS_2$, $MoSe_2$, $WSe_2$, and $WS_2$, and the floating gate may include one of graphene, graphene oxide, carbon nanotube, and $MoS_2$.

In example embodiments, the tunneling insulating layer may include one of $SiO_2$, $Al_2O_3$, $ZrO_2$, $HfO_2$, $Ta_2O_5$, and h-BN, and the blocking insulating layer may include one of $Al_2O_3$, $ZrO_2$, $HfO_2$, $Ta_2O_5$, and h-BN.

In example embodiments, the channel layer is formed using a metal organic chemical vapor deposition MOCVD process.

In example embodiments, a thickness of the blocking insulating layer may be greater than a thickness of the tunneling insulating layer.

In example embodiments, the thickness of the blocking insulating layer is about 20 nm and the thickness of the tunneling insulation layer is about 10 nm.

In example embodiments, the source and the drain are formed of Ti and Au electrodes formed by an electron beam deposition process.

In example embodiments, the Ti electrode is an adhesive layer.

In example embodiments, the tunneling insulating layer is formed by an atomic layer lamination process.

In example embodiments, the floating gate is formed by chemical vapor deposition CVD process.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. The drawings are as follows.

DETAILED DESCRIPTION

Figure 1:
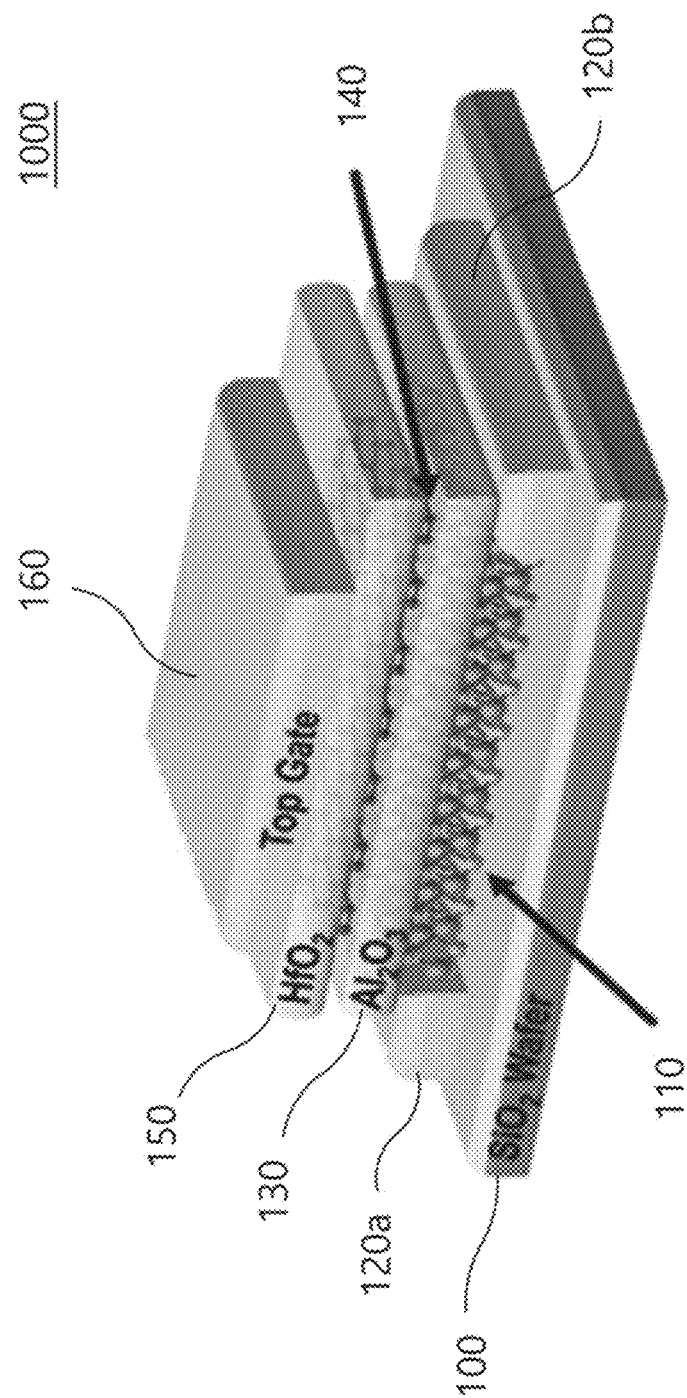
FIG. 1 is a perspective view illustrating a flash memory device according to an embodiment of the present invention.

Hereinafter, an exemplary embodiment of the present disclosure will be described with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Also, in describing the components of the present disclosure, there may be terms used like the first, second, A, B, (a), and (b). These are solely for the purpose of differentiating one component from the other but not to imply or suggest the substances, order or sequence of the components. If a component were described as 'connected', 'coupled', or 'linked' to another component, it may mean the components are not only directly 'connected', 'coupled', or 'linked' but also are indirectly 'connected', 'coupled', or 'linked' via a third component.

FIG. 1 is a perspective view illustrating a flash memory device according to an embodiment of the present invention. Referring to FIG. 1, the flash memory device 1000 includes a substrate 100, a channel layer 110, source 120a and drain 120b, a tunneling insulating layer 130, a floating gate 140, and a blocking insulating layer 150 and a top gate 160.

The substrate 100 may be one of an insulating material (e.g., glass), a semiconductor or a conductor covered with an insulating material, or a material having semiconductor properties (e.g., a silicon wafer). According to an embodiment, the substrate 100 may be formed of highly doped p-type Si obtained by thermally growing Sift.

The channel layer 110 is disposed on the substrate 100 and may be made of a two-dimensional material. According to an embodiment, the channel layer 110 may include one of $MoS_2$, $MoSe_2$, $WSe_2$, and $WS_2$. For example, $MoS_2$ has a large band gap of 1.2 eV for bulk and 1.8 eV for single-layer, and can exhibit excellent thermal and ambient stability with a high electrostatic integrity. In addition, the channel film 110 including $MoS_2$ may be formed using a metal organic chemical vapor deposition MOCVD process.

The source 120a and drain 120b may be disposed to face each other at both ends of the channel layer 110. Each of the source 120a and drain 120b may be a Ti/Au electrode sequentially formed by an electron beam deposition process. In this case, the Ti layer may serve as an adhesive layer.

The tunneling insulating layer 130 is disposed on the channel layer 110 and may cover at least a portion of each of the source 120a and drain 120b. The tunneling insulating layer 130 may include a material having a first dielectric constant. For example, the tunneling insulating layer 130 may include one of $SiO_2$, $Al_2O_3$, $ZrO_2$, $HfO_2$, $Ta_2O_5$, and h-BN. For example, according to an embodiment, the tunneling insulating layer 130 may include $Al_2O_3$ having a dielectric constant of about 10. Meanwhile, the tunneling insulating layer 130 may be formed using an atomic layer deposition process.

As such, the channel layer 110 is encapsulated with the tunneling insulating layer 130 made of a high-K material, thereby reducing Coulomb scattering and fixed phonon dispersion, thereby improving the performance of the flash memory device 1000.

The floating gate 140 is disposed on the tunneling insulating layer 130 and may be made of a two-dimensional 2D material. According to an embodiment, the floating gate 140 may include one of graphene, graphene oxide, carbon nanotube, and $MoS_2$. For example, graphene has a high density of states and work function of 4.6 eV and serves as a deep potential well for charge trapping, so it may be suitable as the floating gate 140. In addition, the floating gate 140 including graphene may be formed using a chemical vapor deposition CVD process.

The blocking insulating layer 150 may be disposed on the floating gate 140. The blocking insulating layer 150 may include a material having a second dielectric constant greater than the first dielectric constant. In particular, the blocking insulating layer 150 may include a high-K material having a dielectric constant greater than that of silicon oxide. For example, the blocking insulating layer 150 may include one of $Al_2O_3$, $ZrO_2$, $HfO_2$, and h-BN. According to an embodiment, the blocking insulating layer 150 may include $HfO_2$ having a dielectric constant of about 25.

The top gate 160 may be disposed on the blocking insulating layer 150. The top gate 160 may include sequentially stacked Ti/Au, and may be formed by a stacking process and E-beam deposition.

The main operating mechanism of the flash memory device 1000 is based on the trapping/de-trapping of electrons in the floating gate 140. For operation, a sufficiently high voltage $V_{tg}$ pulse is applied to the top gate 160 electrode, which forms the tunneling voltage $V_{tunnel}$ across the tunneling insulating layer 130 due to the coupling ratio of the flash memory device 1000.

Basically, a capacitive divider is defined as $C_{block}/(C_{tunnel}+C_{block})$, where $C_{block}$ is the capacitance between the top gate 160 and the floating gate 140, and $C_{tunnel}$ is the capacitance between floating gate 140 and the channel layer 110. The high coupling ratio improves the tunneling efficiency.

In an embodiment of the present invention, the tunneling insulating layer 130 includes a material having a first dielectric constant, and the blocking insulating layer 150 includes a material having a second dielectric constant greater than the first dielectric constant. Accordingly, tunneling efficiency can be improved, and thus non-linearity can be improved.

Meanwhile, the tunneling insulating layer 130 and the blocking insulating layer 150 may have different thicknesses. For example, the tunneling insulating layer 130 may have a thickness of about 10 nm, and the blocking insulating layer 150 may have a thickness of 20 nm.

Figure 2A:
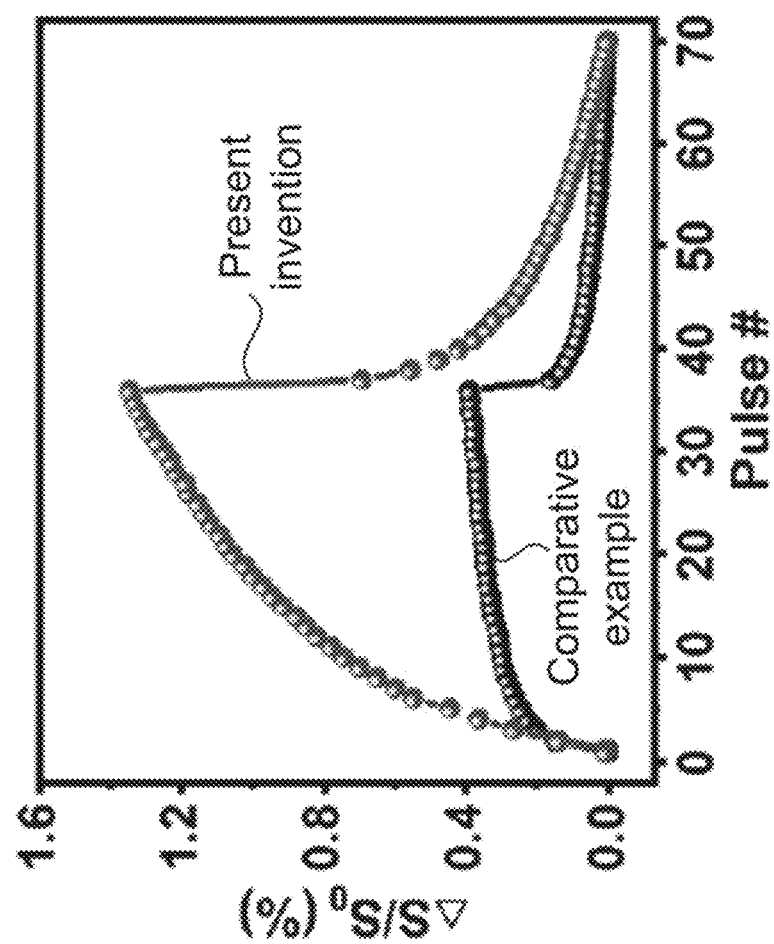
FIGS. 2A and 2B are diagrams illustrating a change in synaptic weight and a change in non-linearity due to a difference in coupling ratio between a flash memory device according to an embodiment of the present invention and a flash memory device according to a comparative example.
Figure 2B:
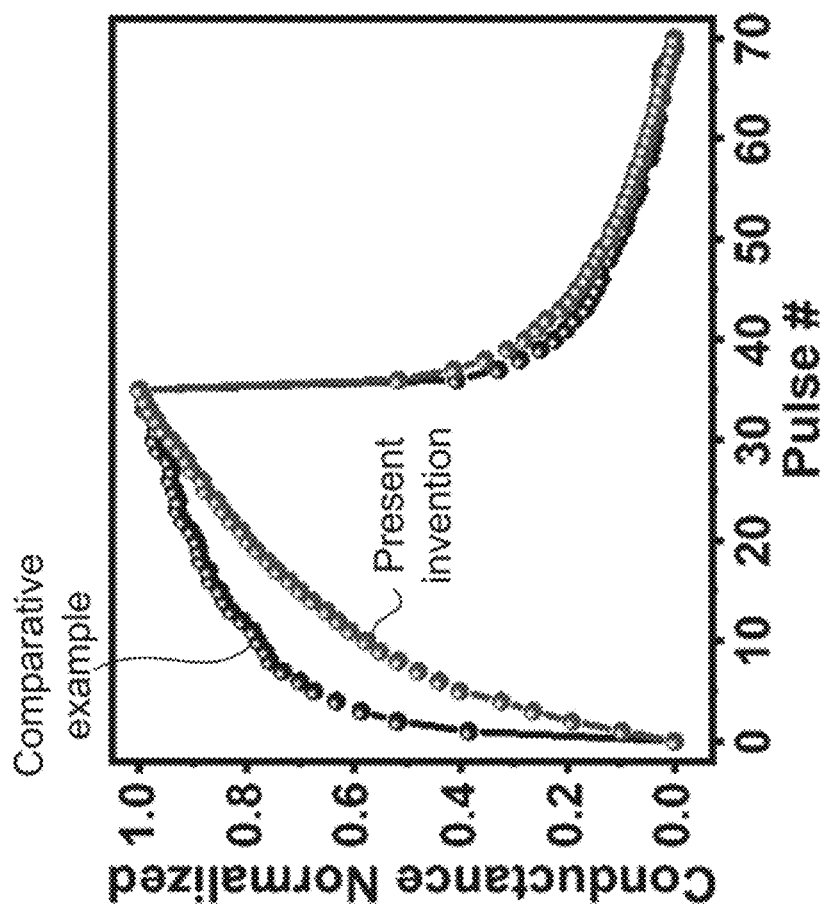

FIG. 2A is a graph showing a change of a synaptic weight due to a difference in coupling ratios of a flash memory device 1000 according to an embodiment of the present invention and a flash memory device according to a comparative example. FIG. 2B is a graph illustrating a change in non-linearity due to a difference in coupling ratios of a flash memory device 1000 according to an embodiment of the present invention and a flash memory device according to a comparative example.

A flash memory device 1000 according to an embodiment of the present invention has $MoS_2$ grown by MOCVD as a channel layer 110, 14 nm $Al_2O_3$ as a tunneling insulating layer 130, graphene as a floating gate, and 24 nm $HfO_2$ as a blocking insulating layer 150.

The flash memory device according to the comparative example is the same as the flash memory device 1000 of the embodiment except that 28 nm $Al_2O_3$ is used as a blocking insulating layer. That is, in the embodiment, the dielectric constant of the tunneling insulating layer 130 is about 10, and the blocking insulating layer 150 is about 25, and there is a difference in dielectric constant between the tunneling insulating layer 130 and the blocking insulating layer 150. However, in the comparative example, the tunneling insulating layer and the blocking insulating layer are used as $Al_2O_3$ and have the same dielectric constant. The embodiment shows a coupling ratio of about 0.59, and the comparative example shows a coupling ratio of 0.33.

The same voltage pulse train is applied to the embodiment and comparative example, respectively, in which −15V is applied at a 0.1 msec pulse width in potentiation, and +13V is applied at 0.1 msec pulse width in depression. Referring to FIGS. 2A and 2B, the embodiment having a higher coupling ratio shows a higher on/off ratio, thereby better non-linearity can be expected.

Figure 3A:
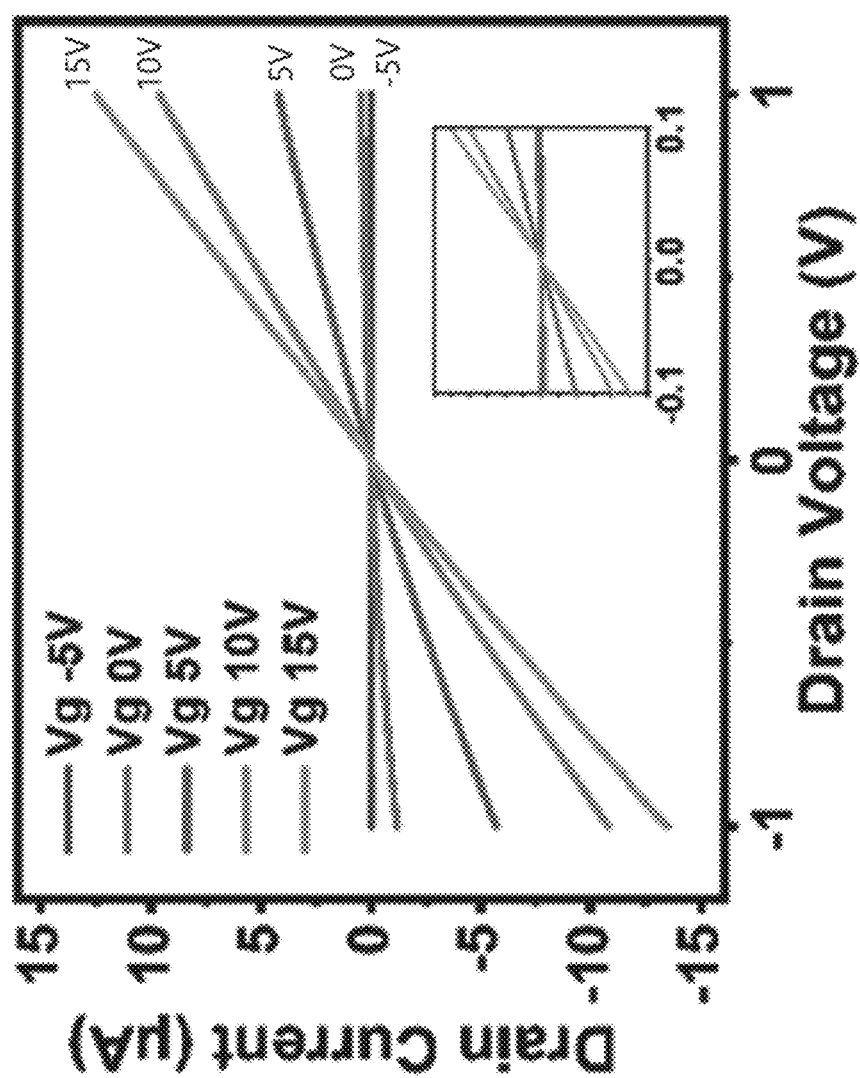
FIGS. 3A and 3B are graphs illustrating electrical characteristics of a flash memory device according to an embodiment of the present invention.
Figure 3B:
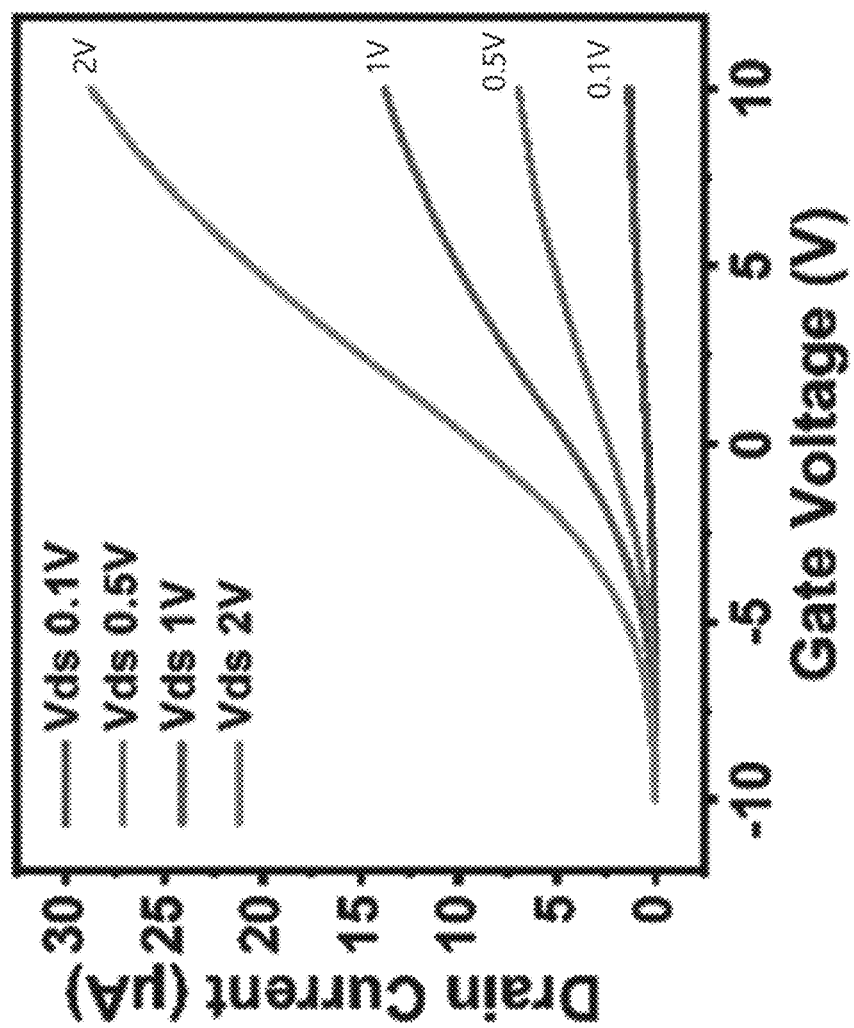

FIGS. 3A and 3B are graphs illustrating electrical characteristics of a flash memory device according to the embodiment of the present invention. FIG. 3A shows an output characteristics (Ids-Vds) of the flash memory device 1000, and FIG. 3B shows a transfer characteristics (Ids-Vtg) of the flash memory device 1000.

Referring to FIG. 3A, measurements were made from −1V to +1V in 5 mV steps under different top gate voltage Vtg bias conditions (from −5V to +15V in steps of 5V), showing clear gate modulation. The inset graph in FIG. 3A shows that the device contact formed an ohmic contact.

Referring to FIG. 3B, the fabricated flash memory device 1000 exhibits an n-type behavior that is always ON in a positive drain bias region. The transfer curve was obtained by sweeping top gate voltage Vtg from −10V to +10V in 100 mV steps while drain-source voltage Vds increasing gradually from 0.1V to 2V. The field effect mobility of the flash memory device is 3.07 $cm^2V^{-1}s^{-1}$, calculated using Equation 1.

$$\mu = \left(\frac{dI_{ds}}{dV_{tg}}\right) \times \left[\frac{L}{WC_iV_{ds}}\right]$$ [Equation 1]

where L and W are the channel length (5 μm) and width (5 μm), respectively, and Ci is the capacitance between the channel and the top gate per unit area (series capacitance of 10 nm $Al_2O_3$ and 20 nm $HfO_2$, Ci=4.92×$10^3 Fm^2$).

In high-efficiency neuromorphic computing, several synaptic device properties such as multi-level weighted states (multi-conductance levels), asymmetry and non-linearity, power consumption, and variability of synaptic devices must be considered. The capacity for high-conductance states along with good linear synaptic updates leads to better learning capability and improved network robustness.

By improving the tunneling effect of the flash memory device according to the embodiment of the present invention, it can be shown that the flash memory device 1000 improves the non-linearity of synaptic weights. In addition, by emulating spike-timing-dependent plasticity (STDP) in the top-gated floating memory device of the present invention, the possibility of a spiking neural network SNN-based neuromorphic computing system can be confirmed.

Experimental Example

A $MoS_2$ channel film was grown on a $Si/SiO_2$ (300 nm) substrate via metal-organic chemical vapor deposition MOCVD. The MOCVD reactor consists of a 4.3-inch quartz tube and a three-zone heating furnace. As a transition metal precursor, molybdenum hexacarbonyl (MHC: Sigma-Aldrich 577766, >99.9% purity) was used, and as a chalcogen precursor, diethyl sulfide (DES: Sigma-Aldrich 107247, >98%) was used. The pressure of both precursors in the bubbler was kept constant at 800 Torr, and the temperature in the MHC canister was kept at 60° C. The optimal flow rates of MHC, DES, $H_2$, and Ar for the growth of the $MoS_2$ channel film were 0.6 sccm, 1.2 sccm, 5 sccm, and 1000 sccm, respectively, where the kinetics of precursor decomposition controlled the thickness of the $MoS_2$ film.

$MoS_2$ few-layers grown by MOCVD were transferred to the substrate using a wet transfer method. The substrate was composed of heavily doped p-type Si on which 300 nm $SiO_2$ was thermally grown.

MOCVD-grown $MoS_2$ on a $SiO_2/Si$ substrate was first spin-coated with polymethyl methacrylate (PMMA) and then baked at 170° C. for 2 min. For $MoS_2$ transfer, the PMMA/$MoS_2$/$SiO_2$/Si stack was immersed in DI water to separate the PMMA/$MoS_2$ film from the substrate. The film is then transferred to the target substrate and then heated on a hot plate at 70° C. for 10 min to remove water and ensure good adhesion between the film and the substrate. Then, it was immersed in acetone for 2 hours to remove PMMA, and then dried with $N_2$ gas.

Then, the few-layer $MoS_2$ was etched with an $O_2$ cleaner or reactive ion etching to form a channel film. Ti/Au electrodes, each 5 nm/100 nm thick, were deposited by electron beam evaporator for the source and drain contacts. Here, Ti served as an adhesive layer. It was then annealed at 300° C. for 2 h in a 5% forming gas of $H_2/N_2$. During this annealing process, PMMA residues from the wet transfer process, photoresist residues, and other contaminants on the sample surface were removed.

A tunneling insulating film of 10 nm $Al_2O_3$ was deposited by ALD process at 150° C. Next, a CVD-grown few-layer graphene film on Cu foil was spin-coated with PMMA and then baked at 170° C. for 2 minutes. The Cu foil portion was removed by floating the PMMA/graphene/Cu foil stack on the copper etchant for 2 hours. The stack was then transferred several times to a clean wafer to rinse the Cu etchant residue. Finally, the thoroughly rinsed PMMA/graphene stack was transferred to the target substrate, followed by a PMMA removal process. A blocking insulating film of 20 nm $HfO_2$ and a top gate electrode (Ti/Au 5 nm/100 nm) were deposited by ALD and E-beam evaporator, respectively.

Hereinafter, the non-linearity of the synaptic weights improved by the flash memory device according to an embodiment of the present invention will be described.

To mimic the potentiation and depression of biological synapses, two voltage pulse trains were sequentially applied to the gate electrode to update the weights, and the device drain current was read after each pulse was applied. Here, the voltage pulse applied to the gate represents a neuronal spike, and the measured drain current represents a synaptic weight.

In the flash memory device, when a positive voltage pulse is applied to the top gate, electrons are charged in the floating gate. When the floating gate is charged with electrons, these trapped electrons screen the gate electric field, thus increasing the threshold voltage. On the other hand, when a negative voltage pulse is applied to the top gate, electrons trapped in the floating gate are effectively removed and the threshold voltage is decreased. In the experiment, first 35 negative voltage pulses were applied to the gate for potentiation (increasing the drain current), then 35 positive pulses were applied to the gate for depression (decreasing the drain current). The applied pulse amplitudes were −10 V with 1 μs pulse width and +8 V with 1 μs pulse width, respectively, followed by a drain current read operation (Vtg=0 V and Vds=0.1 V) after each pulse was applied.

The non-linearity of potentiation and depression updates in synaptic devices is one of the keys to achieving high accuracy in neuromorphic systems. The non-linearity factor is derived from Equations 2 and Equation 3 below.
Potentiation:

$$G_{pot}=G_1(1-e^{-vP})+G_{min} \quad \text{[Equation 2]}$$

Depression:

$$G_{dep}=G_{max}-G_1(1-e^{-v(1-P)}) \quad \text{[Equation 3]}$$

where $$G_1 = \frac{G_{max} - G_{min}}{1 - e^{-v}},$$

Gmax and Gmin are the maximum and minimum conductance, respectively, and v is the parameter of non-linearity. P is the normalized pulse number.

Figure 4A:
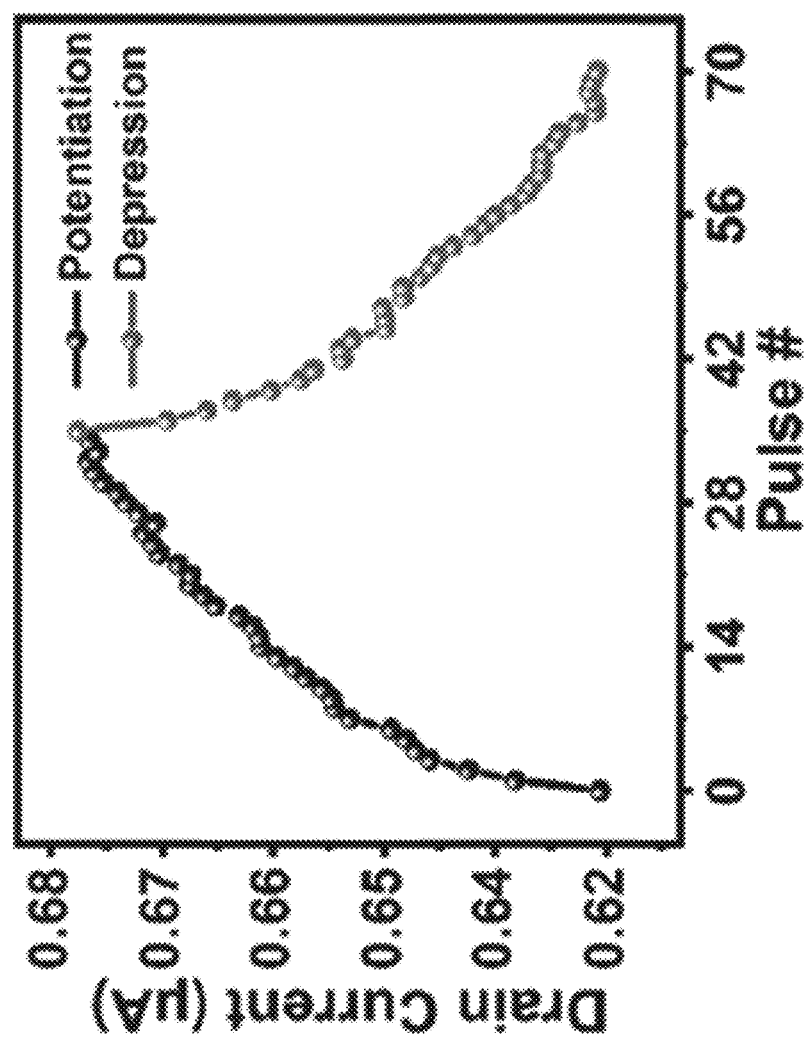
FIGS. 4A to 4C are graphs illustrating non-linearity characteristics in a synaptic weight state of a flash memory device according to an embodiment of the present invention.
Figure 4B:
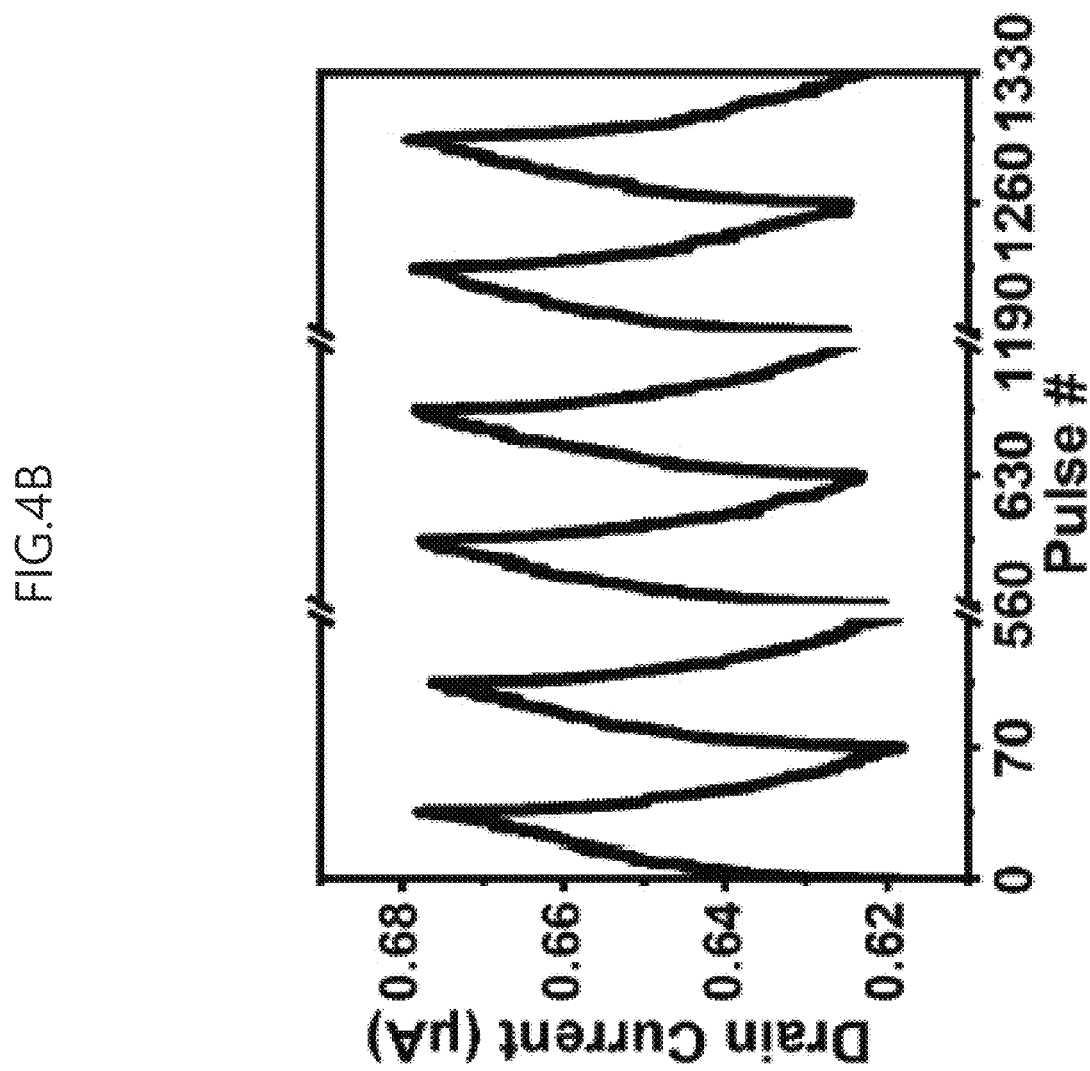
Figure 4C:
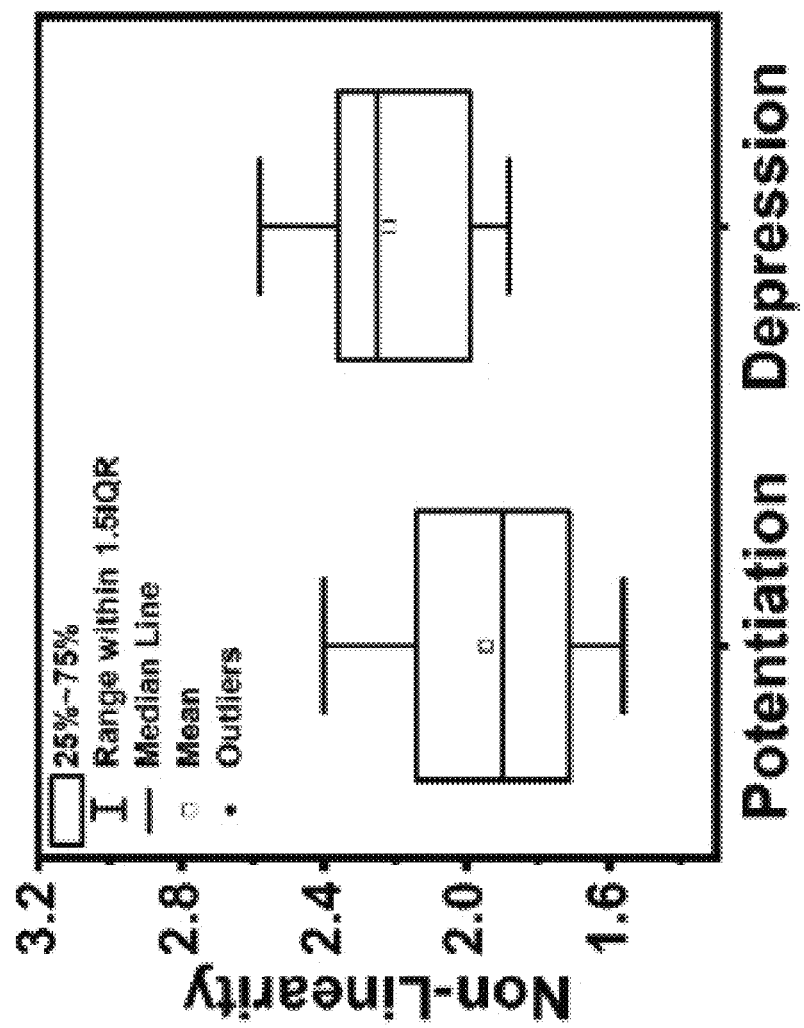

FIGS. 4A to 4C are graphs illustrating non-linearity characteristics in a synaptic weight state of a flash memory device according to an embodiment of the present invention.

Referring to FIG. 4A, current modulation using negative and positive voltage pulses is shown. −10V pulses of 1 μs pulse width and +8 V pulses of 1 μs pulse width were applied 35 times, respectively. The flash memory device according to the experimental example has 36 synaptic weight states and shows a low non-linearity of 1.83 for the potentiation curve and 1.88 for the depression curve.

Referring to FIG. 4B, the flash memory device according to the experimental example showed a linear and repeatable (19 cycles) potentiation and depression operation when a negative pulse and a positive pulse were repeatedly applied (1330 pulses), which indicates robustness of the device.

Referring to FIG. 4C, a box plot of non-linearity values is shown, with the mean non-linearity values obtained in the multi-cycle experiment being 1.94 and 2.22 for potentiation and depression, respectively.

Figure 5A:
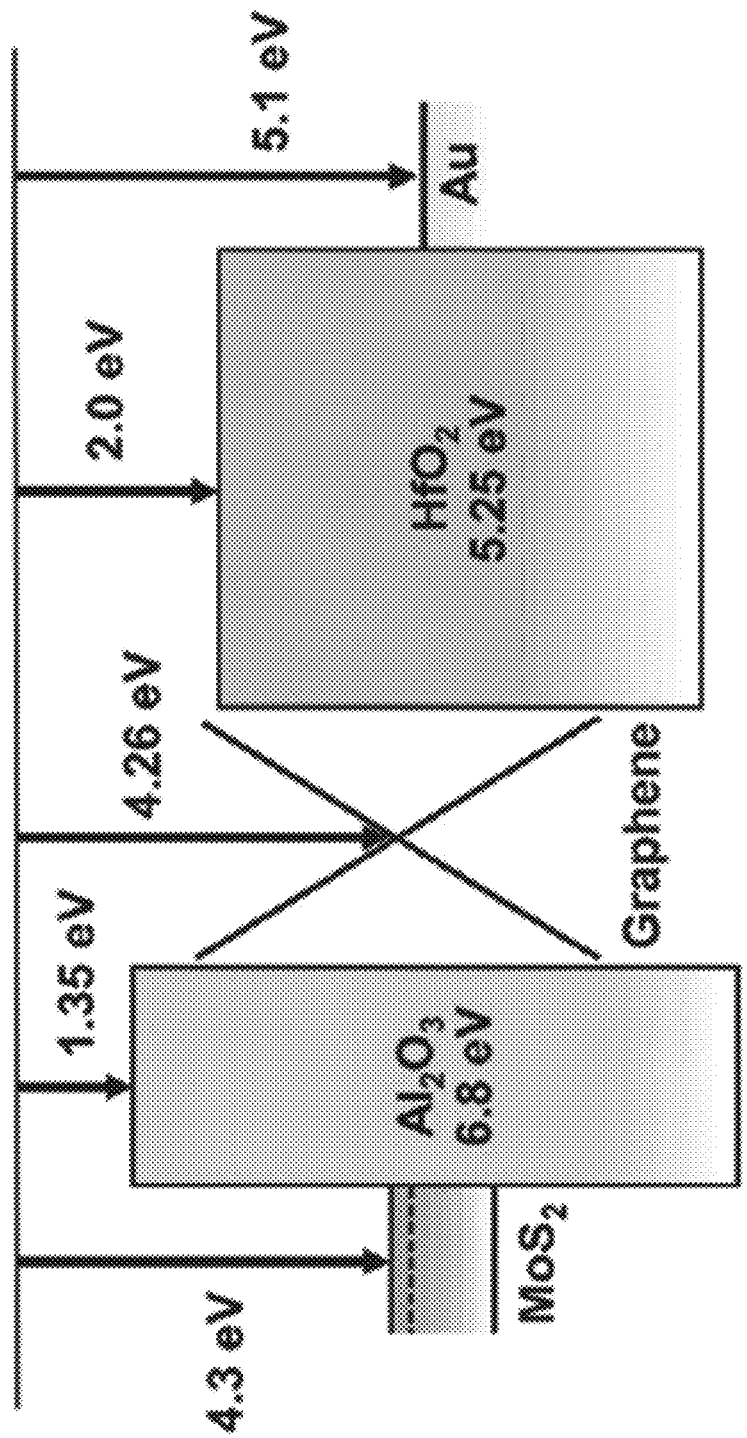
FIGS. 5A to 5C are energy band diagrams illustrating an operating principle of a flash memory device according to an embodiment of the present invention.
Figure 5B:
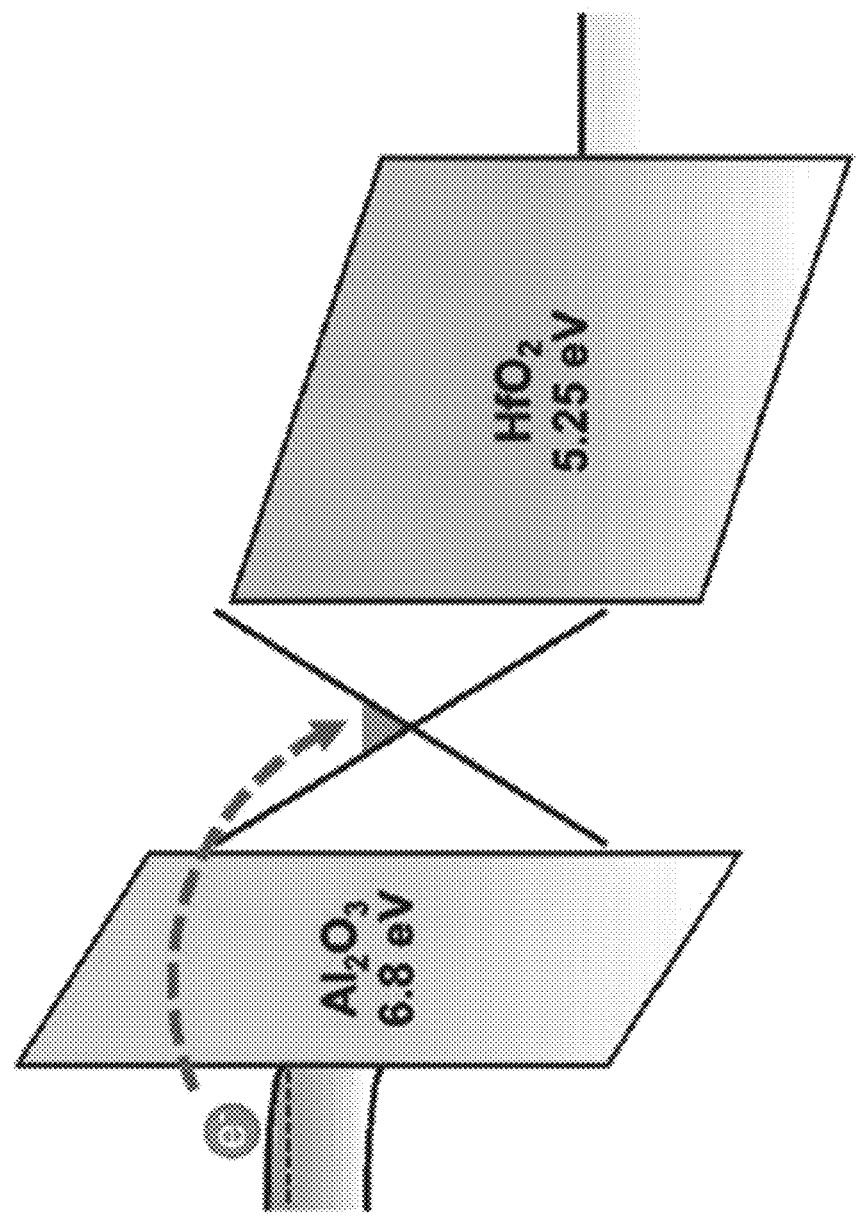
Figure 5C:
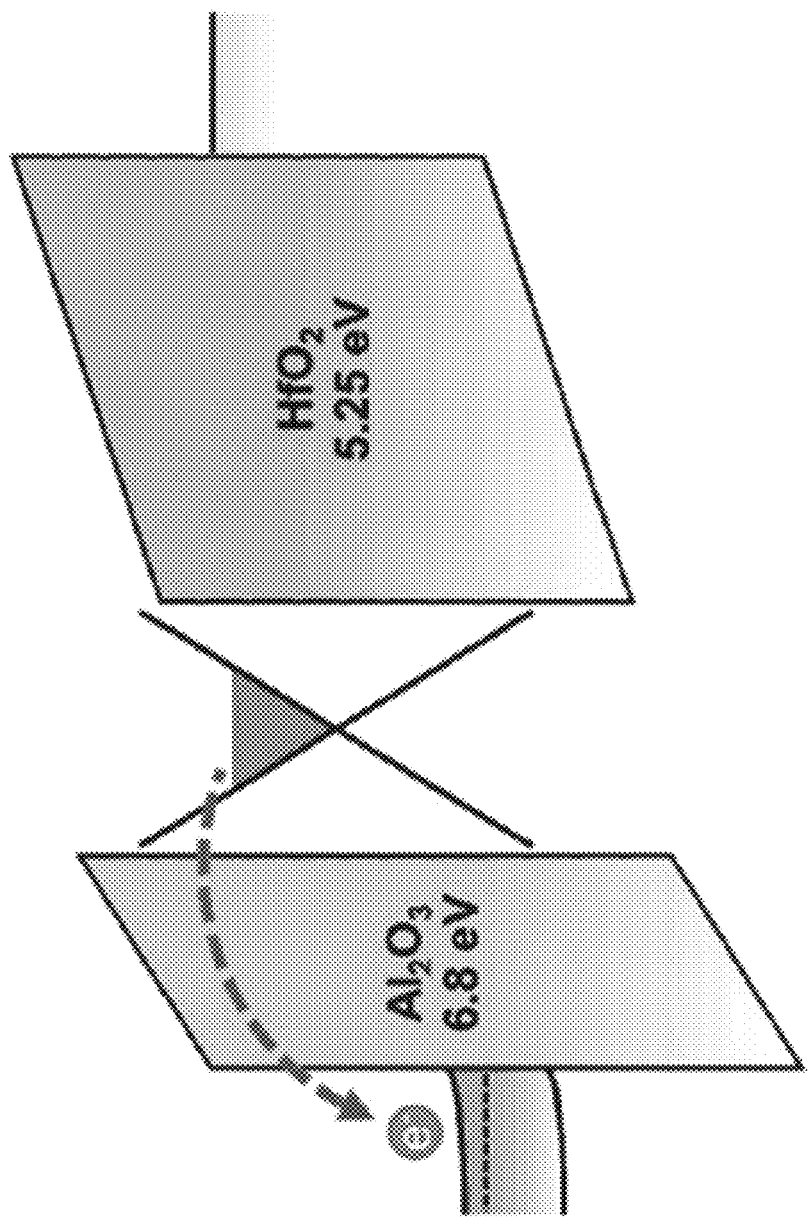

FIGS. 5A to 5C are energy band diagrams illustrating an operating principle of a flash memory device according to an embodiment of the present invention. In FIGS. 5A to 5C, the energy bandgap Eg and electron affinity (χ) are about 1.2 and 4.3 eV for the few-layer $MoS_2$, 6.8 and 1.35 eV for $Al_2O_3$, and 5.25 and 2.0 eV for $HfO_2$, respectively. The electron affinity of graphene is 4.26 eV.

Referring to FIG. 5A, the barrier height for electron tunneling from the $MoS_2$ channel through the $Al_2O_3$ layer to the graphene floating gate is approximately 3 eV.

Referring to FIG. 5B, when a high positive voltage pulse (depression operation of synaptic update) is applied to $V_G$ ($V_G>0$), electrons are able to tunnel from $MoS_2$ to the graphene floating gate through $Al_2O_3$. The thickness of the blocking insulating film ($HfO_2$) prevents tunneling to the top gate. The tunneled electrons accumulated in the graphene floating gate screen the top gate electric field, resulting in a positive Vth shift and a decrease in conductance.

On the other hand, referring to FIG. 5C, when a negative voltage pulse (potentiation operation of synaptic update) is applied to $V_G$ ($V_G<0$), electrons are transmitted back from the graphene floating gate to the $MoS_2$ channel, resulting in a negative Vth shift and increase in the conductance.

In addition, the applied pulse conditions were modulated to investigate synaptic weight updates in various cases, as modulation of pulse width and amplitude affects electron tunneling and thus synaptic weights are changed.

FIGS. 6A to 6F are graphs illustrating characteristics according to a pulse condition modulated in a flash memory device according to an embodiment of the present invention.

Figure 6A:
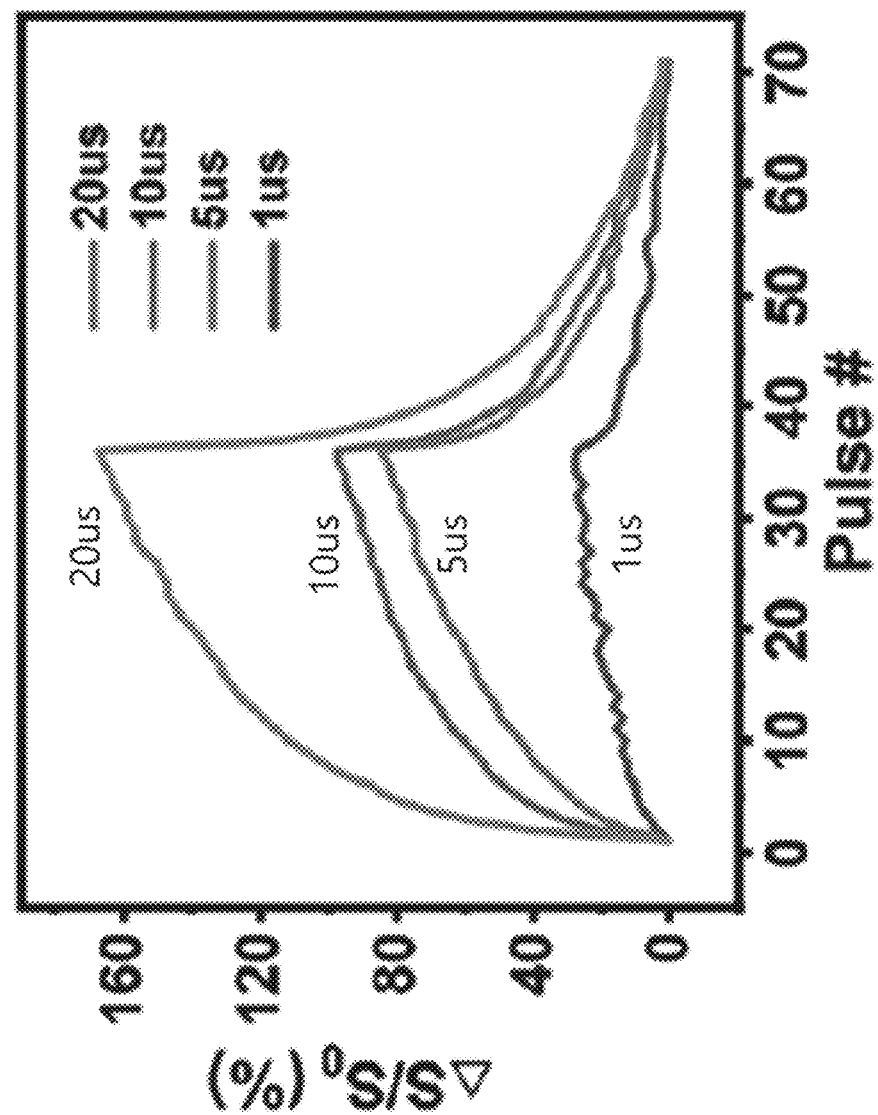
FIGS. 6A to 6F are graphs illustrating characteristics according to a pulse condition modulated in a flash memory device according to an embodiment of the present invention.

FIG. 6A shows the results of using four different pulse widths (1, 5, 10 and 20 μs) with pulse amplitudes of −10V for potentiation and +8V for depression. Ten pulse cycles were applied in each case.

Figure 6B:
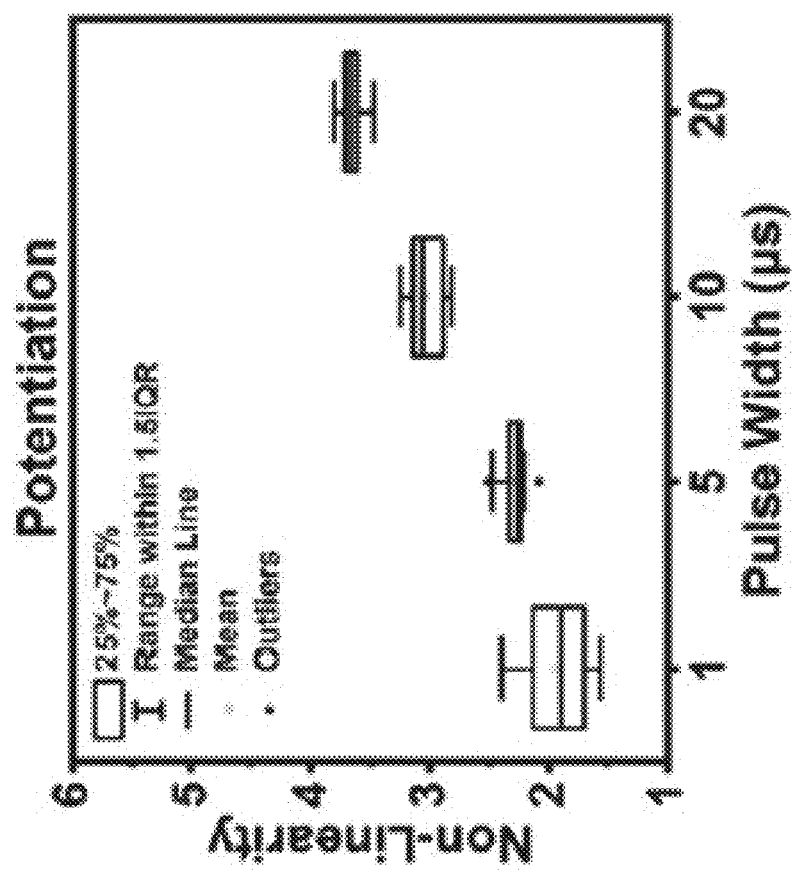
Figure 6C:
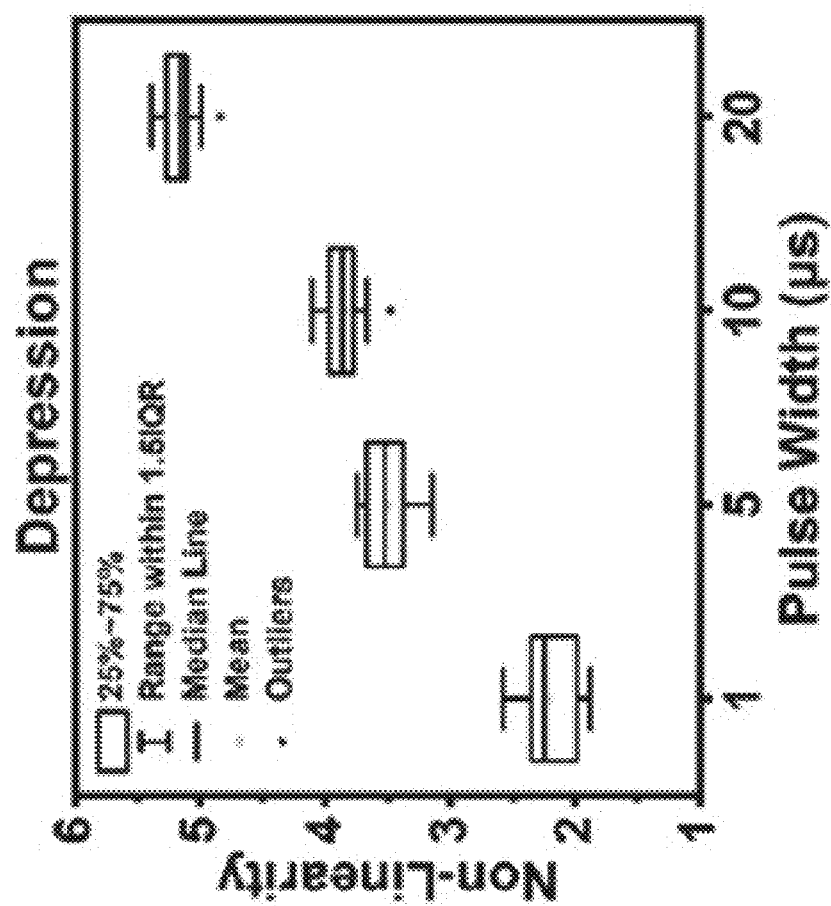

In FIGS. 6B and 6C, non-linearity increases with increasing pulse width in potentiation and depression. Since it has been reported that a higher number of conductance levels (weighted beats) in the synaptic device improves the learning accuracy of the neural network, the effect of the synaptic weight level on the non-linearity of the experimental example was investigated.

Figure 6D:
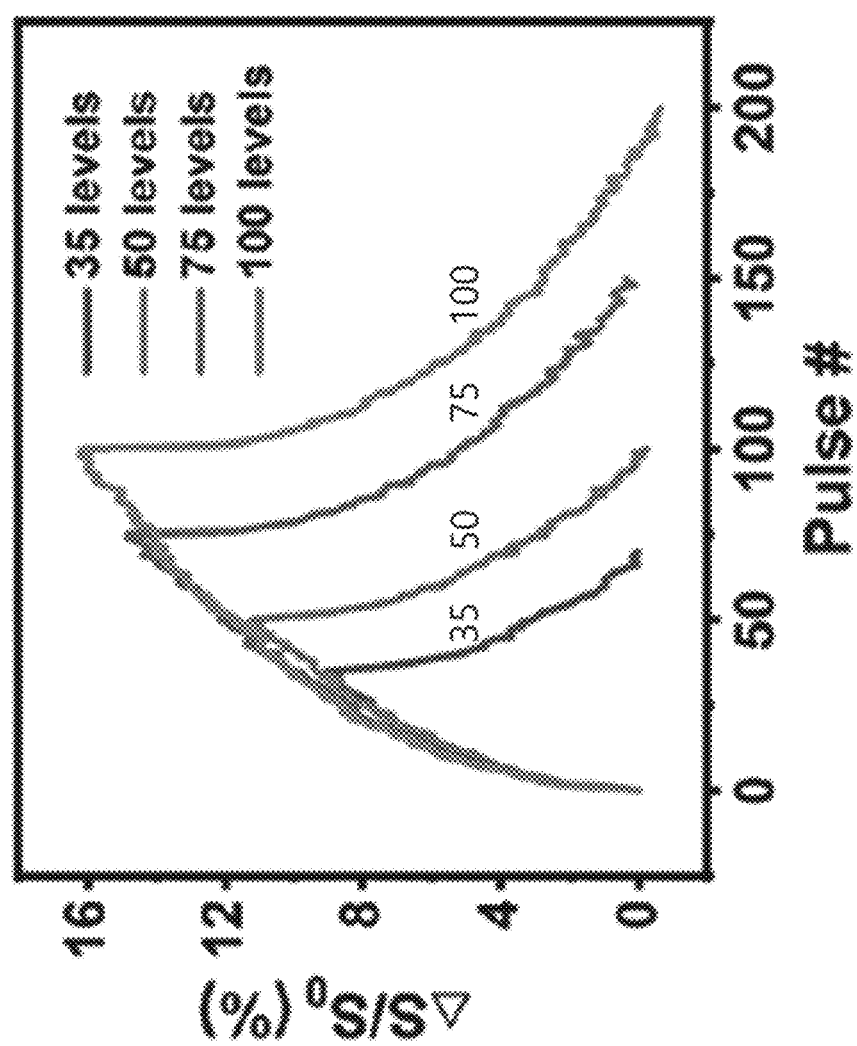

As can be seen in FIG. 6D, four different conductance levels (35, 50, 75 and 100) under the same pulse width and amplitude conditions used in FIG. 4A were tested in device of present application.

Figure 6E:
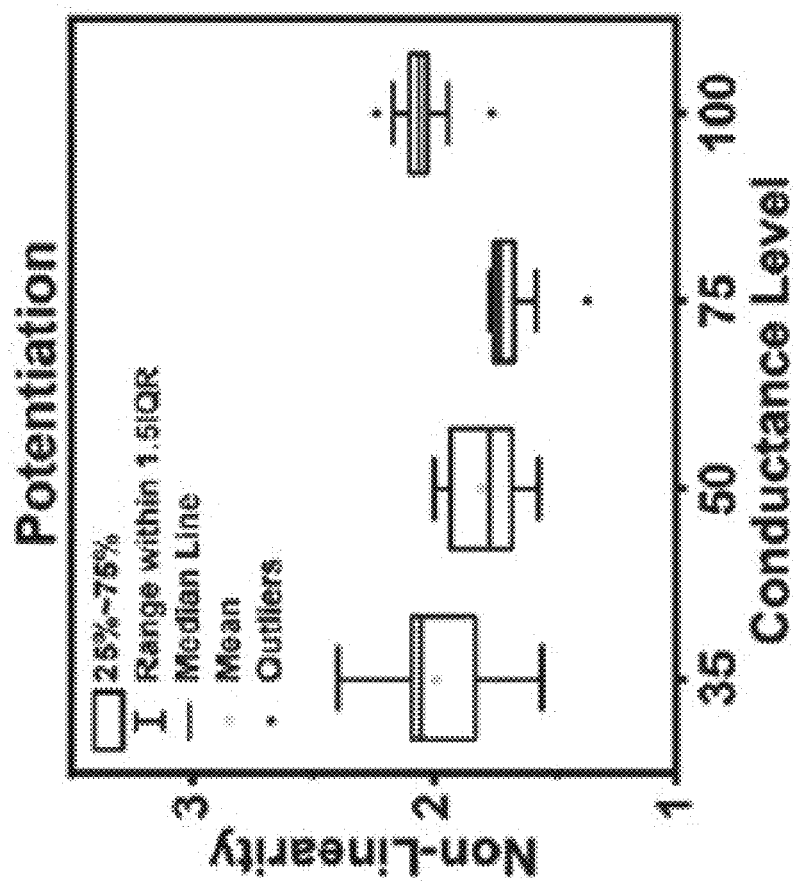
Figure 6F:
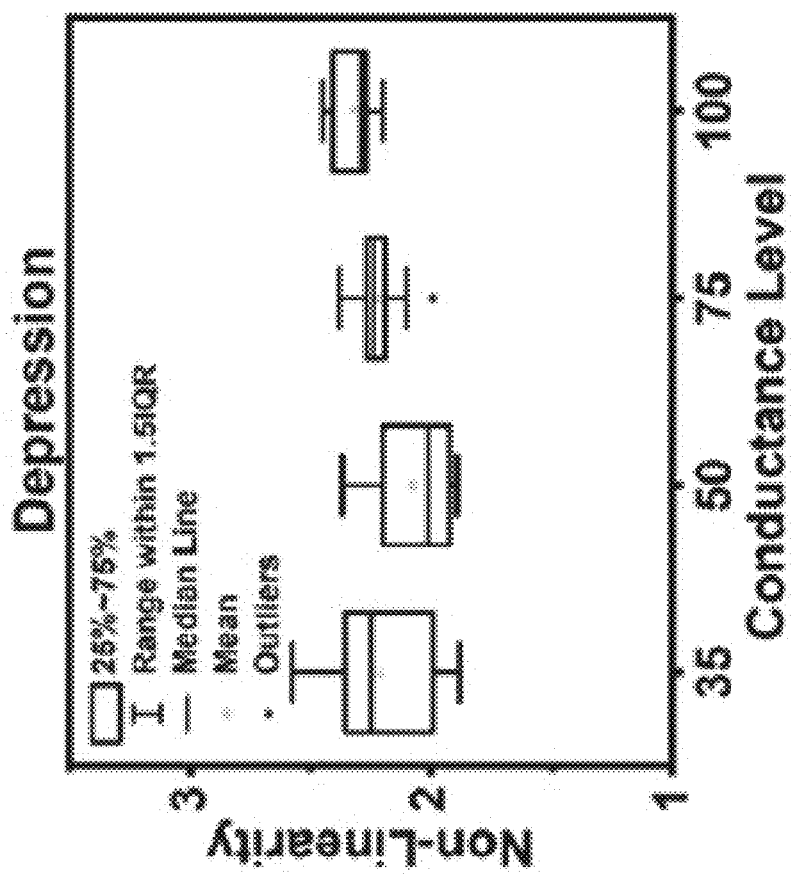

The non-linearity value extracted in FIGS. 6E and 6F is maintained around 2 regardless of the weight levels, which imply that the flash memory device according to embodiments of the present invention can be applied to various neural system systems with different weight update levels.

Hereinafter, the STDP operation is demonstrated to confirm the synaptic plasticity of the flash memory device according to an embodiment of the present invention.

STDP is a popular learning rule in spiking neural networks SNNs; it modulates synaptic weights according to the difference in spike timing between a pre-synaptic neuron (Vpre) and a post-synaptic neuron (Vpost). Several different shaped pulse sets were applied to describe the STDP behavior.

Figure 7A:
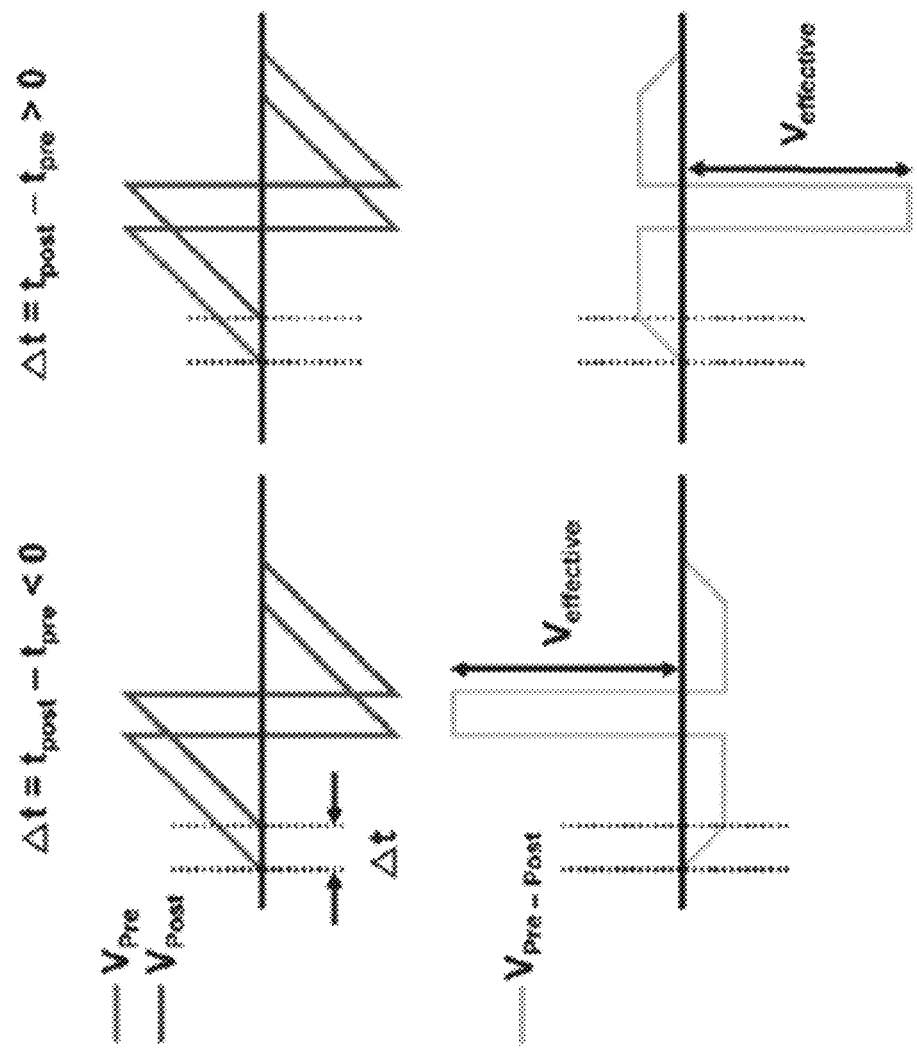
FIG. 7A shows voltages of pre-synaptic neurons and post-synaptic neurons applied to the flash memory device
Figure 7B:
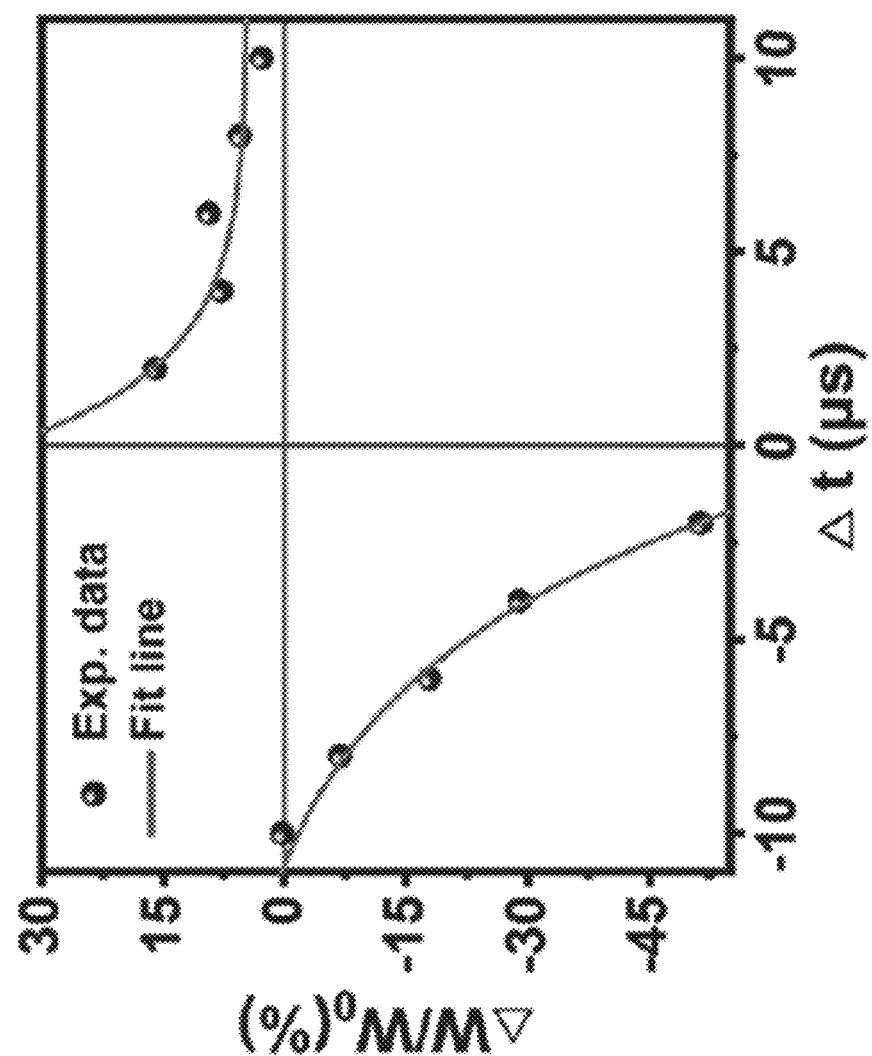

FIG. 7A shows voltages of a pre-synaptic neuron (Vpre) and a post-synaptic neuron (Vpost) applied to the flash memory device according to an embodiment of the present invention, and FIG. 7B is the STDP result of FIG. 7A.

To demonstrate STDP behavior, a set of multiple differently shaped pulses, which contained information about the timing difference between the Vpre and Vpost is applied to the top gate. The pulses at Vpre and Vpost have the same shape but arrive at two different time points (tpre and tpost) with varying time differences (Δ=tpost−tpre). The summation of Vpre and Vpost (applied voltage Vapplied=Vpre−Vpost) was applied to the experimental example of the present invention as shown in FIG. 7A.

When Δt is greater than 0, the positive portion of Vapplied always has a low amplitude, while the negative portion of Vapplied has an amplitude large enough to change the current value (synaptic weight) of the device. Likewise, when Δt is less than 0, the negative portion of Vapplied has a low amplitude that cannot readily change the weight, while the positive portion has a large amplitude that causes the weight to change. In both cases, the effective part (Veffective) of changing the weight was positive when Δt<0 and negative when Δt>0, and it takes as much time as Δt.

The STDP result can be seen in FIG. 7B. The dots represent the amount of conductance change at each Δt, and the red line indicates that the result can be fitted as an exponential decay function in both polarities. In both polarities, the shorter Δt, the greater the weight change.

The STDP result suggests that the flash memory device according to an embodiment of the present invention can be applied to an SNN-based neuromorphic hardware system.

As described above, embodiments of the present invention have been described with reference to the accompanying drawings, but those of ordinary skill in the art to which the present invention pertains can implement the present invention in other specific forms without changing the technical spirit or essential features. Therefore, it should be understood that the embodiments described above are illustrative in all respects and not restrictive.

What is claimed is:

1. A flash memory device comprising:
a substrate;
a channel layer disposed on the substrate and made of a two-dimensional material;
a source and a drain disposed at both ends of the channel layer;
a tunneling insulating layer disposed on the channel layer and having a first dielectric constant;
a floating gate disposed on the tunneling insulating layer and made of a two-dimensional material;
a blocking insulating layer disposed on the floating gate and having a second dielectric constant greater than the first dielectric constant; and
an upper gate disposed on the blocking insulating layer;
wherein a thickness of the blocking insulating layer is greater than a thickness of the tunneling insulating layer,
wherein the channel layer includes at least one of $MoS_2$, $MoSe_2$, $WSe_2$, and $WS_2$, and the floating gate includes at least one of graphene, graphene oxide, carbon nanotube, and $MoS_2$,
wherein the tunneling insulating layer includes at least one of $SiO_2$, $Al_2O_3$, $ZrO_2$, $HfO_2$, $Ta_2O_5$, and h-BN, and the blocking insulating layer includes at least one of $Al_2O_3$, $ZrO_2$, $HfO_2$, $Ta_2O_5$, and h-BN, and
wherein the $MoS_2$ is a few-layered $MoS_2$, and an energy bandgap and electron affinity are about 1.2 and 4.3 eV for the few-layered $MoS_2$, 6.8 and 1.35 eV for the $Al_2O_3$, and 5.25 and 2.0 eV for the $HfO_2$, respectively.

2. The flash memory device of claim 1, wherein the channel layer is formed using a metal organic chemical vapor deposition (MOCVD) process.

3. The flash memory device of claim 1, wherein the thickness of the blocking insulating layer is about 20 nm and the thickness of the tunneling insulation layer is about 10 nm.

4. The flash memory device of claim 1, wherein the source and the drain are formed of a Ti electrode and an Au electrode formed by an electron beam deposition process.

5. The flash memory device of claim 4, wherein the Ti electrode is an adhesive layer.

6. The flash memory device of claim 1, wherein the tunneling insulating layer is formed by an atomic layer lamination process.

7. The flash memory device of claim 1, wherein the floating gate is formed by chemical vapor deposition (CVD) process.

* * * * *